(12) United States Patent
Janisch et al.

(10) Patent No.: US 10,249,499 B2
(45) Date of Patent: Apr. 2, 2019

(54) METHOD FOR MANUFACTURING A SEMICONDUCTOR DEVICE COMPRISING A THIN SEMICONDUCTOR WAFER

(71) Applicant: ABB SCHWEIZ AG, Baden (CH)

(72) Inventors: Wolfgang Janisch, Unterkulm (CH); Atze de Vries, Seengen (CH); Sven Matthias, Lenzburg (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/459,099

(22) Filed: Mar. 15, 2017

(65) Prior Publication Data

US 2018/0151367 A1 May 31, 2018

Related U.S. Application Data

(63) Continuation of application No. PCT/EP2015/070793, filed on Sep. 11, 2015.

(30) Foreign Application Priority Data

Sep. 15, 2014 (EP) .................................... 14184793

(51) Int. Cl.
   *H01L 21/22* (2006.01)
   *H01L 21/225* (2006.01)
   (Continued)

(52) U.S. Cl.
   CPC ........ *H01L 21/225* (2013.01); *H01L 21/2007* (2013.01); *H01L 21/2256* (2013.01);
   (Continued)

(58) Field of Classification Search
   CPC ............. H01L 21/225; H01L 29/66333; H01L 29/66363; H01L 21/673; H01L 21/283;
   (Continued)

(56) References Cited

U.S. PATENT DOCUMENTS

| 5,034,343 A | 7/1991 | Rouse et al. |
|---|---|---|
| 6,872,640 B1 | 3/2005 | Mouli |

(Continued)

FOREIGN PATENT DOCUMENTS

| EP | 1065706 A2 | 1/2001 |
|---|---|---|
| EP | 1065706 A3 | 10/2004 |

(Continued)

OTHER PUBLICATIONS

European Patent Office, International Search Report & Written Opinion issued in corresponding Application No. PCT/EP2015/070793, dated Nov. 23, 2015, 13 pp.

(Continued)

*Primary Examiner* — Vu A Vu

(74) *Attorney, Agent, or Firm* — J. Bruce Schelkopf; Taft Stettinius & Hollister LLP

(57) ABSTRACT

A method for manufacturing a vertical power semiconductor device is provided, wherein a first impurity is provided at the first main side of a semiconductor wafer. A first oxide layer is formed on the first main side of the wafer, wherein the first oxide layer is partially doped with a second impurity in such way that any first portion of the first oxide layer which is doped with the second impurity is spaced away from the semiconductor wafer by a second portion of the first oxide layer which is not doped with the second impurity and which is disposed between the first portion of the first oxide layer and the first main side of the semiconductor wafer. Thereafter a carrier wafer is bonded to the first oxide layer. During front-end-of-line processing on the second main side of the semiconductor wafer, the second impurity is diffused from the first oxide layer into the semiconductor wafer from its first main side by heat generated during the front-end-of-line processing.

20 Claims, 6 Drawing Sheets

(51) Int. Cl.
*H01L 21/20* (2006.01)
*H01L 29/66* (2006.01)
*H01L 29/739* (2006.01)
*H01L 21/762* (2006.01)
*H01L 29/744* (2006.01)
*H01L 21/283* (2006.01)
*H01L 21/673* (2006.01)
*H01L 29/08* (2006.01)

(52) U.S. Cl.
CPC .......... *H01L 21/283* (2013.01); *H01L 21/673* (2013.01); *H01L 21/76256* (2013.01); *H01L 29/66333* (2013.01); *H01L 29/66363* (2013.01); *H01L 29/7395* (2013.01); *H01L 29/744* (2013.01); *H01L 21/2253* (2013.01); *H01L 29/0834* (2013.01); *H01L 29/0873* (2013.01)

(58) Field of Classification Search
CPC ............. H01L 21/2007; H01L 21/2256; H01L 29/744; H01L 21/76256; H01L 29/7395; H01L 21/2253; H01L 29/0834; H01L 29/0873
USPC .......................................................... 438/546
See application file for complete search history.

(56) References Cited

U.S. PATENT DOCUMENTS

| | | | |
|---|---|---|---|
| 7,285,475 B2* | 10/2007 | Czagas | H01L 21/2007 257/E21.088 |
| 8,212,283 B2 | 7/2012 | Storasta et al. | |
| 2007/0264795 A1 | 11/2007 | Miller et al. | |
| 2013/0161636 A1* | 6/2013 | Werkhoven | H01L 33/641 257/76 |
| 2013/0221403 A1 | 8/2013 | Lu | |

FOREIGN PATENT DOCUMENTS

| | | |
|---|---|---|
| EP | 2249392 A2 | 11/2010 |
| EP | 2249392 A3 | 8/2011 |
| WO | 9423444 A2 | 10/1994 |
| WO | 9423444 A3 | 10/1994 |

OTHER PUBLICATIONS

European Patent Office, Extended Search Report issued in corresponding Application No. 14184793.9, dated Jan. 29, 2015, 8 pp.

* cited by examiner

METHOD FOR MANUFACTURING A SEMICONDUCTOR DEVICE COMPRISING A THIN SEMICONDUCTOR WAFER

TECHNICAL FIELD

The present invention relates to the field of power semiconductor devices and in particular to a method for manufacturing a semiconductor device comprising a thin semiconductor wafer which involves front-end-of-line processing on the front side of the semiconductor wafer as well as back side processing.

BACKGROUND INFORMATION

From EP 1 065 706 A2 there are known integrated circuits, semiconductor devices and methods for making the same. Each embodiment shows a diffused, doped backside layer in a device wafer that is oxide bonded to a handle wafer. The diffused layer may originate in the device wafer, in the handle wafer, in the bond oxide or in an additional semiconductor layer of polysilicon or epitaxial silicon. The methods use a thermal bond oxide or a combination of a thermal and a deposited oxide.

From WO 94/23444 A2 there is known low temperature wafer bonding using a chemically reacting material between wafers to form a bonded zone to bond two wafers together. Examples include silicon wafers with a silicon-oxidizing bonding liquid which also permits introduction of radiation hardening dopants and electrically active dopants as constituents of the bonding liquid. Silicon wafers also may use solid reactants which include deposited layers of metal and polysilicon to form silicide bonded zones. Oxidizers such as nitric acid may be used in the bonding liquid, and a bonding liquid may be used in conjunction with a solid bonding reactant. Dielectric layers on silicon wafers may be used when additional silicon is provided for the bonding reactions. Integrated circuits fabricated from such bonded wafers may have buried layers and radiation hardening and buried resistors.

From U.S. Pat. No. 5,034,343 A there is known a process including bonding a first device wafer to a handle wafer by an intermediate bonding oxide layer and thinning the device wafer to not greater than 7 mils. An epitaxial device layer of under 1 mil may be added. Device formation steps are performed on a first surface of the first device wafer. This is followed by removing the handle wafer to produce a resulting wafer having substantially the thickness of the first device layer. To produce a silicon on insulator (SOI), a third device wafer is bonded to the first surface of the first device wafer by the intermediate oxide layer and the third wafer is thinned to not greater than 40 microns. The first and third device wafers form the resulting SOI wafer.

From U.S. Pat. No. 6,872,640 B1 there are known CMOS devices formed with a Silicon On Insulator (SOI) technology with reduced Drain Induced Barrier Lowering (DIBL) characteristics and a method for producing the same. The method involves a high energy, high dose implant through openings in a masking layer and through channel regions of the p- and n-wells, into the insulator layer, thereby creating a borophosphosilicate glass (BPSG) diffusion source within the insulation layer underlying the gate regions of the SOI wafer substantially between the source and drain. Backend high temperature processing steps induce diffusion of the dopants contained in the diffusion source into the p- and n-wells, thereby forming asymmetric retrograde dopant profiles in the channel under the gate. The method can be selectively applied to selected portions of a wafer to tailor device characteristics, such as for memory cells.

From US 2013/0221403 A1, a manufacturing process for a low voltage IGBT of 400 V is known, which has been optimized for low conduction and switching losses while having improved mechanical stability by having a lower thickness in the active area and a higher thickness in the termination area by an increased thickness of the p collector layer. The device is manufactured by providing a p doped CZ wafer and an n-doped FZ wafer, on which an n doped buffer layer has been implanted and annealed. The two wafers are bonded together with a SiO film in between and n-wafer thickness is reduced to 40 µm. Now front sided layers are created and then the wafer is thinned on the back side in the active region, but thickness is maintained in the termination region. Afterwards boron is implanted over the entire back side in the buffer layer in the active region and into the p doped FZ wafer in the termination region. Laser anneal is performed for driving-in the p dopant.

Lowering the production costs is an important goal in the manufacturing of semiconductor devices. One means for lowering the costs in manufacturing of semiconductor devices is to use semiconductor wafers with a larger diameter. Using larger wafers can significantly increase the yield in semiconductor device manufacturing. Semiconductor power devices such as insulated gate bipolar transistors (IGBTs) are meanwhile manufactured on wafers with diameters up to 300 mm.

In fabrication of vertical power devices, such as IGBTs, bi-mode insulated gate transistors (BIGTs), PIN diodes, gate turn off (GTO) thyristors and others, for which the current runs through the device in a direction vertical to the wafer plane, front and back side are to be subjected to production processes. Backside processing includes forming of a buffer layer, an anode layer and/or of a cathode layer by ion implantation and subsequent thermal activation. Since the device thickness does not fit to the SEMI (Semiconductor Equipment and Materials International) standards for the particular wafer sizes handling of thinned wafers must be mastered. Handling of thin large wafers involves the risk of wafer breakage or mechanical damage.

A known manufacturing method for a semiconductor device is explained briefly with reference to FIGS. 1a to 1f. First a low-doped n-type silicon wafer 1 with a front side 2 and a back side 3 as shown in FIG. 1a is subjected to front-end-of-line processing on the front side 2. The term front-end-of-line-processing shall include all semiconductor device manufacturing process steps up to (but not including) the deposition of metallization layers. Exemplarily, it shall include all high temperature process steps with a temperature above 900° C. In case of manufacturing an IGBT front-end-of-line processing results in a topology on the front side 2 of the wafer 1 with inter alia p-type regions 4, oxide layers 5 and poly-silicon gates 6 as shown in FIG. 1b. During all front-end-of-line high temperature treatments an edge termination region (not shown in the figures) is driven into the wafer 1 from its front side 2 up to a depth of 15 µm. Subsequently to the front-end-of-line processing a top metallization layer 7 is formed on the front side. Thereafter the wafer 1 is thinned to obtain a thinned wafer 1' as shown in FIG. 1c. Thinning of wafer 1 usually includes a combination of mechanical grinding and chemical etching. Next back side processing of the thinned wafer 1' is performed. In a first step of the back side processing, an n-type buffer layer 8 is formed on the back side 3' of the thinned wafer 1' by deep diffusion as shown in FIG. 1d. Thereafter a thin highly doped p-type anode layer 9 is formed on the back side of the thinned wafer by diffusion of a p-type dopant into the thinned wafer 1' from its backside 3' as shown in FIG. 1*e*. The implanted dopants of the n-type buffer layer 8 and of the p-type anode layer 9 have to be activated by a heat treatment. To avoid affecting the processed front side of the wafer laser thermal annealing (LTA) processes are state of the art for activation of the buffer layer 8 and the anode layer 9. A final step of the back side processing is forming of a back side metallization 10 on the anode layer 9 as shown in FIG. 1*f*.

In the method described above the thinning process is carried out at a late stage of the manufacturing method after front-end-of-line processing and forming the top metallization layer to minimize the risk of wafer breakage when handling the thinned wafer. A pressure has to be applied in the mechanical grinding process for thinning the wafer and leaves an imprint of any topology or structure formed on the front side surface or in the stack of layers of the wafer. Therefore, uniformity of thinning is deteriorated by the topology formed on the wafer. Further, back side processing requires handling of the thinned wafer and, accordingly, involves the risk of wafer breakage. Also any contact of the front side of the wafer with a wafer support during treatment of the backside results easily in particles on the front side or damaging the front side.

As an alternative approach to further minimize the risk of wafer breakage it can be considered to form the buffer layer before thinning the wafer by deep diffusion. However, the necessary depth of such deep diffusion of the buffer layer increases with increasing thickness of the layer to be removed during the thinning process. Due to the fact that larger wafers have a larger thickness according to the SEMI standards forming of the buffer layer by deep diffusion before thinning of the wafer is not feasible anymore for wafers with a diameter of 200 mm or more.

Manufacturing the device including the buffer layer by epitaxy on a wafer is another possible approach to avoid handling of a thinned wafer and to minimize the risk of wafer breakage. However, epitaxy of semiconductor layers has the disadvantage that it involves higher costs compared to the above described method for manufacturing a semiconductor device.

SUMMARY OF THE INVENTION

It is the object of the invention to provide a method for manufacturing a semiconductor device comprising a thin wafer which can minimize the risk of wafer breakage, can avoid generation of particles on the front side during backside treatments, can avoid damaging the front side during back side treatments, can avoid non-uniform thickness of the wafer in the final device and is cost efficient at the same time.

The object is attained by a method for manufacturing a vertical power semiconductor device according to claim 1. In the method of the invention according to claim 1, the semiconductor wafer is in a state bonded to a carrier wafer during the front-end-of-line processing. Accordingly, the risk of wafer breakage is minimized during the front-end-of-line processing no matter how thin the semiconductor wafer is. Moreover, the semiconductor wafer is still bonded to the carrier wafer when the doped layer is formed on the first main side of the semiconductor wafer by diffusion of the second impurity into the semiconductor wafer from its first main side by heat generated during the front-end-of-line processing. Therefore, the risk of wafer breakage due to handling a thin semiconductor wafer is further reduced compared to the above described known method where forming the anode layer 9 involves handling of the thinned semiconductor wafer 1'. Finally, the second impurity has not to be activated by an additional heat treatment, such as by a LTA process, like the buffer layer 8 and the anode layer 9 have to be in the above described know method. This can avoid generation of particles on the front side during backside treatments and can avoid damaging the front side during back side treatments.

In the method according to claim 1 the second portion of the first oxide layer which is not doped with the second impurity acts as a diffusion barrier for the second impurity. During the front-end-of-line processing step the second impurity has to diffuse first through this second portion of the first oxide layer before it diffuses into the semiconductor wafer. By adjusting the thickness of the second portion of the first oxide layer which is not doped with the second impurity, the diffusion depth of the second impurity in the semiconductor wafer can be adjusted. Exemplarily, the delayed diffusion of the second impurity into the semiconductor wafer compared to the diffusion of the first impurity into the semiconductor wafer allows to lower the ratio of the diffusion depth of the second impurity relative to that of the first impurity in the semiconductor wafer.

Further developments of the disclosure are specified in the dependent claims.

In an exemplary embodiment the method for manufacturing a semiconductor device comprises a step of thinning the semiconductor wafer after the step (i) of providing a semiconductor wafer but before the front-end-of-line processing step (v). This feature has the advantage that the thinning of the wafer is not deteriorated by the topology formed during the front-end-of-line processing step (v) and the uniformity of the wafer thickness in the final device is improved.

In an exemplary embodiment the step of thinning the semiconductor wafer is performed by thinning the semiconductor wafer from its second main side only after the bonding step (iv). That feature has the advantage that the risk of wafer breakage during and before the bonding step (iv) is reduced.

In another exemplary embodiment the step of thinning the semiconductor wafer is performed before the first oxide layer forming step (iii).

In an exemplary embodiment the semiconductor wafer is thinned to a final thickness of the semiconductor wafer in the semiconductor device in the step of thinning the semiconductor wafer.

In an exemplary embodiment the first oxide layer is formed by thermal oxidation. Thermal oxidation is a most cost efficient method for forming a silicon oxide. Further, thermal oxidation results in a silicon oxide layer with a very homogeneous thickness.

In an exemplary embodiment the step of applying a first impurity onto the first main side of the semiconductor wafer is performed by ion implantation of the first impurity into the semiconductor wafer from its first main side and a buffer layer in the semiconductor device is formed by diffusion of the implanted first impurity due to heat generated in subsequent method steps. Exemplarily, in case that the first oxide layer is formed by thermal oxidation, the implanted first impurity can be driven into the semiconductor wafer by heat generated during the thermal oxidation of the semiconductor wafer.

In an exemplary embodiment a third impurity is implanted into the semiconductor wafer through the first oxide layer to form a second buffer layer by diffusion of the implanted third impurity due to heat generated in subsequent method steps. In such manner a stepped buffer including the first and the third impurities may be formed.

In an exemplary embodiment the carrier wafer has a second oxide layer formed on its surface at least where the carrier wafer (115) comes into contact with the first oxide layer (112) during the bonding step (iv) as a barrier for the impurities in the carrier wafer during the front-end-of-line processing step (v).

In an exemplary embodiment the front-end-of-line processing step (v) comprises at least a step of forming a first anode layer and/or a first cathode layer in the semiconductor wafer. Exemplarily, a metallization layer is formed on the first main side of the semiconductor wafer subsequent to the front-end-of-line processing.

In an exemplary embodiment the first oxide layer forming step (iii) comprises forming a mask on the first oxide layer and subsequent ion implantation of the second impurity into the first oxide layer through openings in the mask to selectively dope areas of the first oxide layer which are exposed through the openings in the mask.

In an exemplary embodiment the second impurity in the first oxide layer is diffused into the semiconductor wafer by heat generated during the front-end-of-line processing step (v) to form a second anode layer and/or a second cathode layer on the first main side of the semiconductor wafer.

In an exemplary embodiment the semiconductor device is a diode, such as a PIN diode or a field charge extraction (FCE) diode, a gate turn-off (GTO) thyristor, an integrated gate-commutated thyristor (IGCT) or a bipolar transistor such as an insulated to gate bipolar transistor (IGBT), a reverse conducting insulating gate bipolar transistor (RC-IGBT) or a bi-mode insulated gate transistor (BIGT).

BRIEF DESCRIPTION OF THE DRAWINGS

Detailed embodiments of the invention will be explained below with reference to the accompanying figures, in which.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF PREFERRED EMBODIMENTS

Figure 1A:
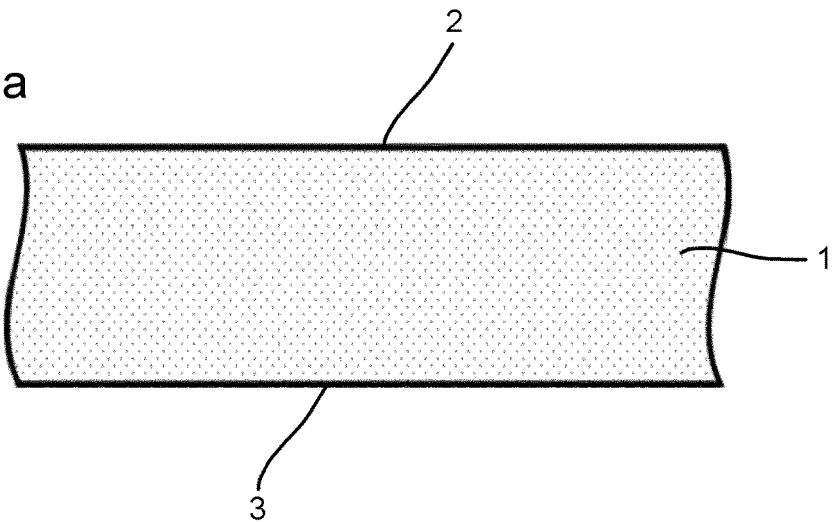
FIG. 1a to 1f illustrate a known method for manufacturing a semiconductor device comprising a thin semiconductor wafer.
Figure 1B:
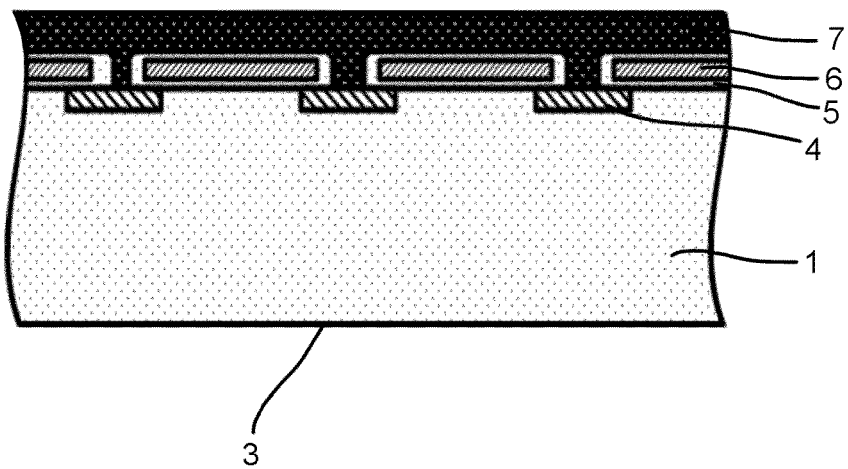
Figure 1C:
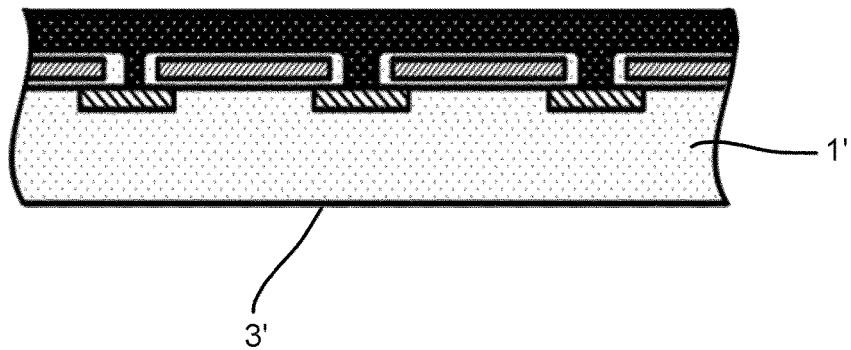
Figure 1D:
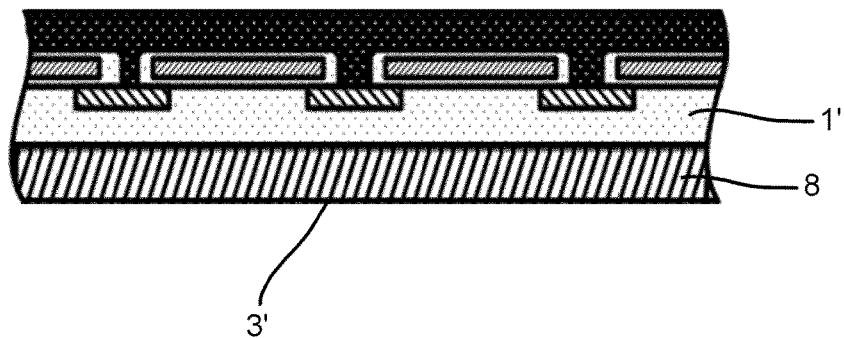
Figure 1E:
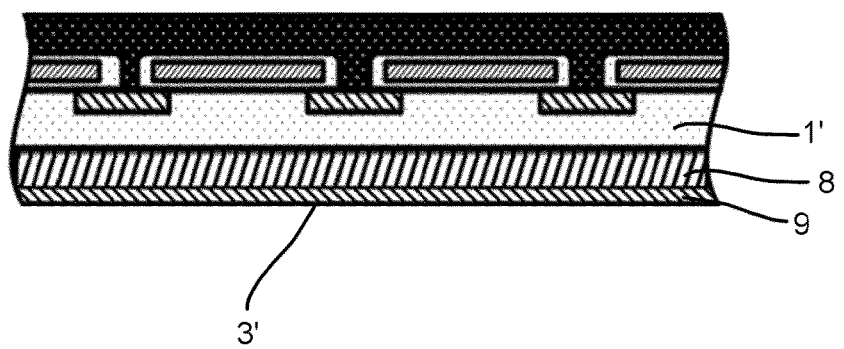
Figure 1F:
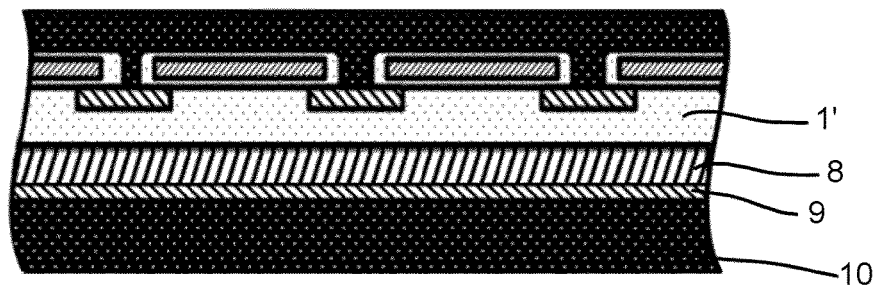
Figure 2A:
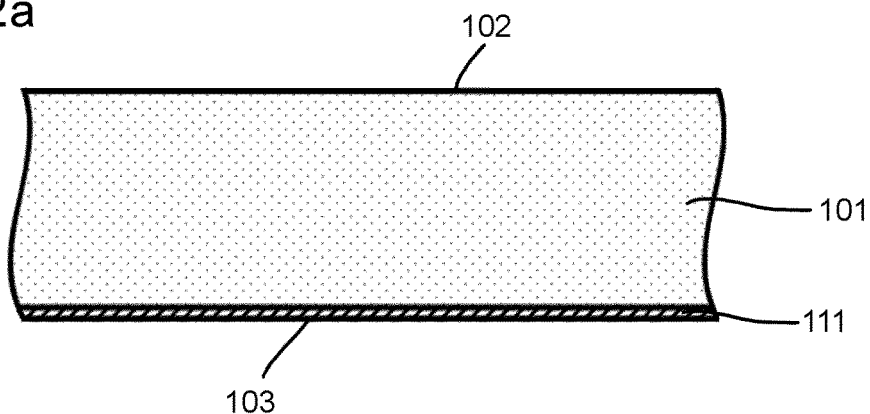
FIGS. 2a to 2f illustrate a first embodiment of the method for manufacturing a semiconductor device according to the invention.
Figure 2B:
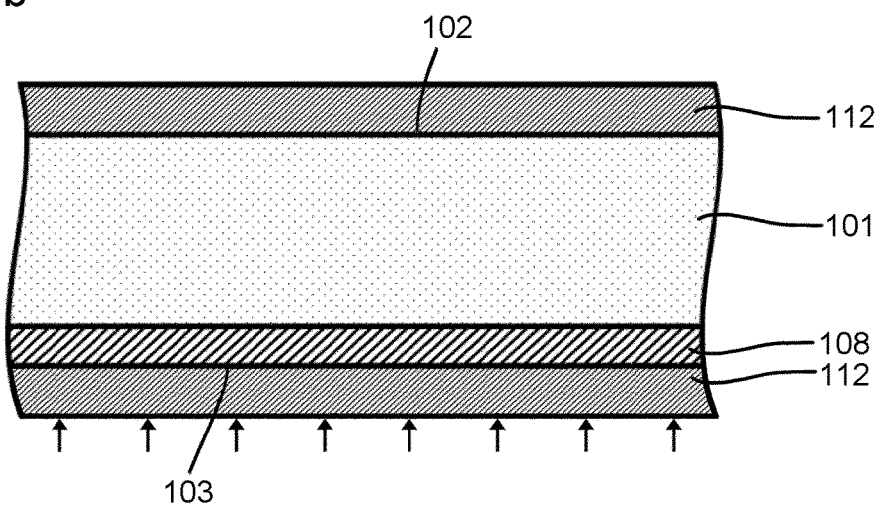

FIGS. 2a to 2f illustrate a first embodiment of the method for manufacturing a semiconductor device according to the invention. In the method according to the first embodiment an insulated gate bipolar transistor (IGBT) is formed. An IGBT is an example for a semiconductor device in the claims. As shown in FIG. 2a, a low-doped n-type silicon wafer 101 having a front side 102 and a back side 103 is first provided. Therein, the silicon wafer is an example for a semiconductor wafer in the claims. The back side 103 forms a first main side of the wafer 101 and the front side 102 forms a second main side of the wafer 101. A thin phosphorous ion implantation layer 111 is formed on the back side of the wafer as also shown in FIG. 2a. Phosphorous is an example for a first impurity in the claims.

As a next process step, thermal oxidation of the wafer 101 is carried out to form a thermal oxide layer 112 on the front side 102 and on the back side 103 of the wafer 101, respectively. The thermal oxide layer 112 is an example for the first oxide layer in the claims. In the present embodiment the thickness of the thermal oxide is in a range between 100 nm and 500 nm. During the thermal oxidation process step the phosphorous of the implantation layer 111 is driven towards the inside of wafer 101 by diffusion to form an n-type layer 108 which will form the buffer layer 108 in the final device. As a next process step, a boron implantation layer 113 is formed in the oxide layer 112 on the back side 103 of the wafer 101 as indicated by arrows in FIG. 2b. The depth of the ion implantation is less than the thickness of the oxide layer 112. Therefore, the boron implantation layer 113 is spaced away from the semiconductor wafer 101 by a portion of the first oxide layer 112 which is not doped with boron and which is disposed between the boron implantation layer 113 and the first main side 103 of the semiconductor wafer 101.

Figure 2C:
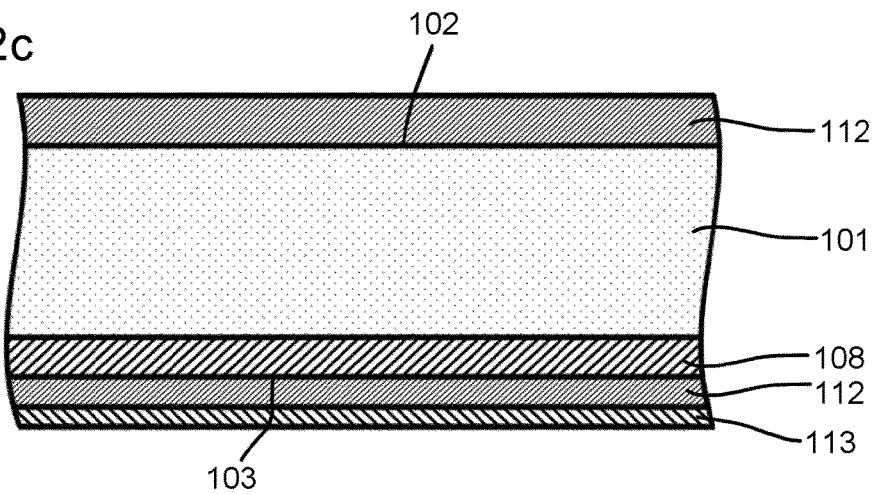

After forming the boron implantation layer 113 in the thermal oxide layer 112 the resulting wafer 101 as shown in FIG. 2c is bonded to a carrier wafer 115 covered with a barrier oxide layer 116 as a barrier for impurities in the carrier wafer 115. The barrier oxide layer 116 is an example for the second oxide layer in the claims. The carrier wafer 115 may be a Czochralski wafer which is produced by a Czochralski process, i.e. by pulling a single crystal against gravity out of a melt which is held in a crucible. The semiconductor wafer 101 may be a Float Zone wafer which is produced by a floating zone process, in which a narrow region of a crystal is molten, and this molten zone is moved along the crystal, thus producing a highly purified crystal. Compared to a Float Zone wafer, a Czochralski wafer has a higher impurity concentration but can be produced much more cost efficient. The bonding is performed as a permanent bonding which makes it possible to perform high temperature process steps in the subsequent front-end-of-line processing described below. The permanent bonding may be made by pressing the wafer 101 to the carrier wafer 115 at high pressure. Afterwards or simultaneously a bond anneal step may be performed at a temperature of at least 300° C. Exemplarily, temperatures of at least 700° C. are applied. A maximum temperature at this step may exemplarily be 800° C.

Figure 2D:
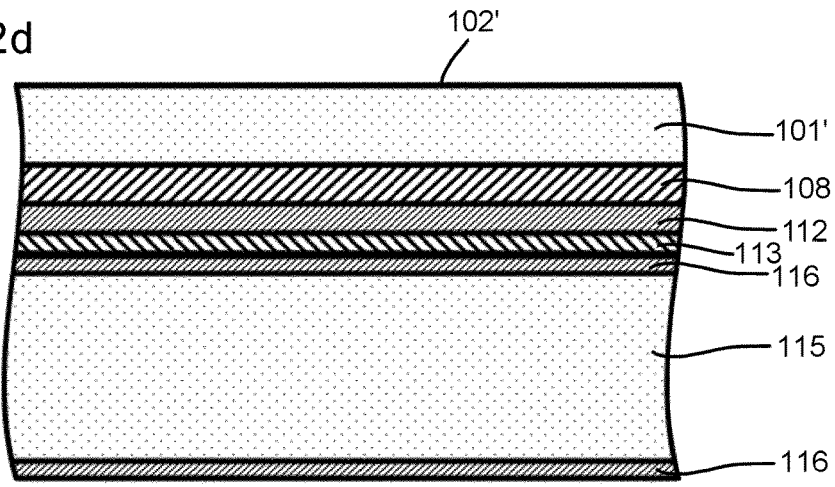

After the bonding step a the wafer 101 is thinned down to a final or desired thickness of the device wafer as shown in FIG. 2d, wherein reference sign 101' refers to the thinned wafer and reference sign 102' refers to the front side of the thinned wafer 101'. The final thickness of the device wafer may be from 115 µm for a device suitable up to 1200V or up to 380 µm for a device suitable for up to 3300 V. Exemplarily the final thickness of the device wafer, i.e. of the thinned semiconductor wafer 101' is between 100 µm and 600 µm. Here, the term device wafer shall mean the semiconductor wafer including all doped semiconductor regions. The thinning process can be performed by mechanical grinding and/or etching, such as chemical etching. Exemplarily, the thinning to process can be performed by chemical-mechanical polishing (CMP). In the thinning process the thermal oxide layer on the front side of the wafer 101 is also removed and the new front side 102' is formed.

Figure 2E:
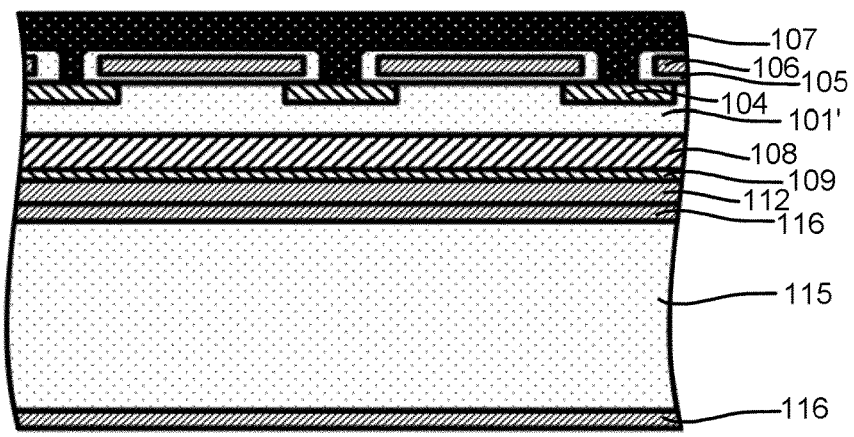

Thereafter, a front-end-of-line processing is performed on the front side 102' of the thinned silicon wafer 101'. In the present embodiment, which shows the manufacturing method for manufacturing an insulated gate bipolar transistor (IGBT), p-type regions 104, n-type regions (not shown in the figures) embedded in the p-type regions 104, oxide layers 105 and poly-silicon gates 106 are formed during front-end-of-line processing as shown in FIG. 2e. During the front-end-of-line processing the boron of the boron implantation layer 113, which is an example for a second impurity, is driven through the oxide layer 112 into the wafer 101' from its backside by diffusion due to heat generated during the front-end-of-line processing to form a p-type anode layer 109. To control the depth and thickness of the anode layer 109 an exact control of the thermal management and of the thickness of the thermal oxide layer 112 as well as of the implantation layer 113 is mandatory. Subsequent to the front-end-of-line processing a metallization layer in form of a top side metallization layer 107 is formed on the topology formed before in the front-end-of-line processing on the front side 102' of the thinned wafer 101'.

Figure 2F:
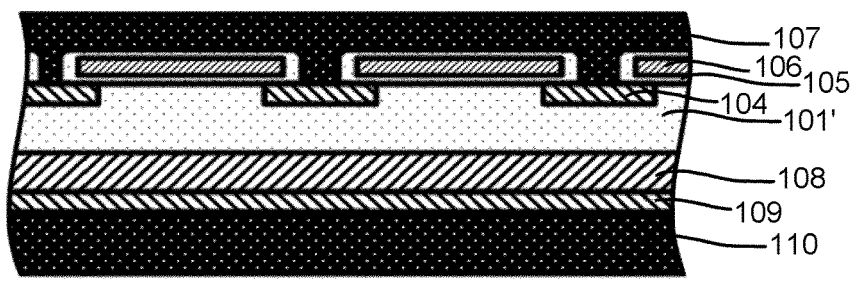

As a next process step, the carrier wafer 115 is removed from the wafer 101' by mechanical grinding and/or etching, such as chemical etching, wherein the damageable wafer front side 102' is covered by a back grinding tape (not shown in the figures). The oxide layer at the bonding interface may serve as an electrical control end point. For instance while grinding the resistance of the surface may be monitored. When the grinding process reaches the oxide layer a sudden change of resistance will occur. The remaining oxide layer may be selectively etched without etching the first wafer 101' to control the removal of the carrier wafer 115 and the oxide layers 112 and 116 between the carrier wafer 115 and the semiconductor wafer 101' without affecting the anode layer 109. Finally, a metallization layer in form of a back side metallization layer 110 is formed on the anode layer 109 to obtain the semiconductor device as shown in FIG. 2f. Forming the back side metallization layer 110 is performed at a temperature below 500° C. for metal evaporation and subsequent sintering.

FIGS. 3a to 3f illustrate a second embodiment of the method for manufacturing a semiconductor device according to the invention. The second embodiment is similar to the first embodiment but the semiconductor device manufactured by the described method is a reverse conducting IGBT (RC-IGBT). The RC-IGBT differs from an IGBT in that in a RC-IGBT a structured anode layer having alternatingly p and n doped regions. Only the differences are described and the same reference numbers as in the first embodiment are used for the same elements.

Figure 3A:
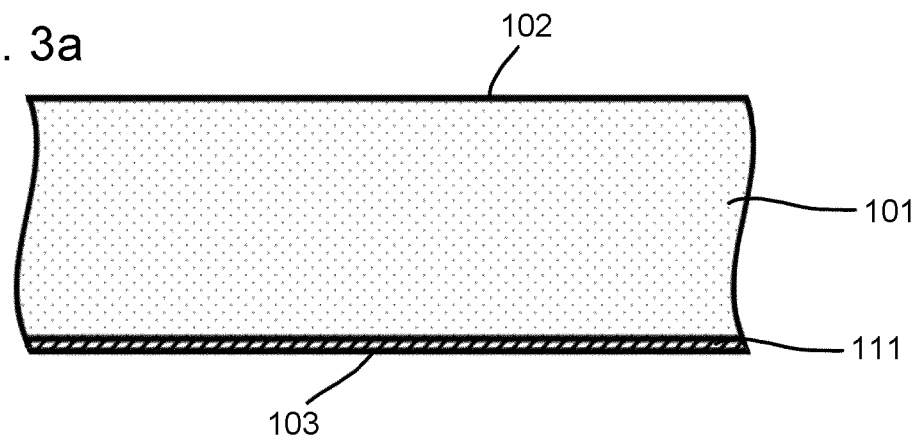
FIGS. 3a to 3f illustrate a second embodiment of the method for manufacturing a semiconductor device according to the invention.
Figure 3B:
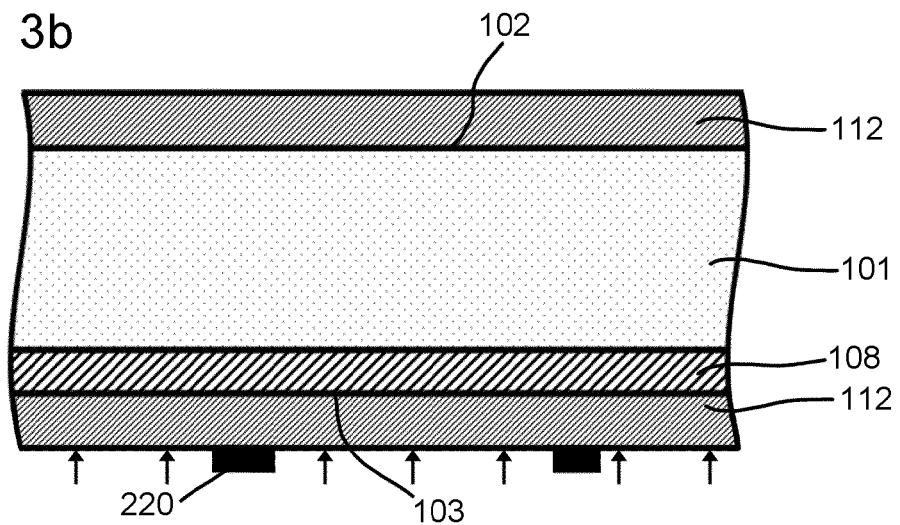
Figure 3C:
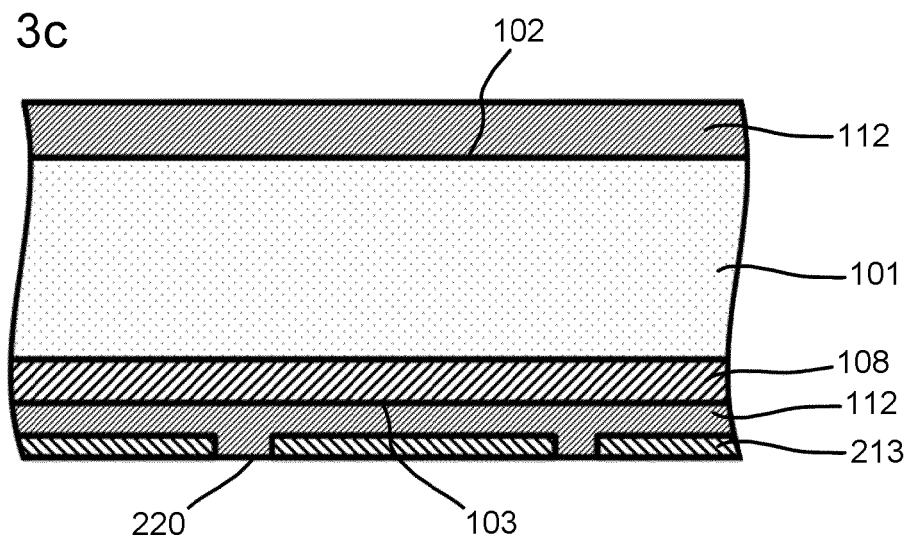
Figure 3D:
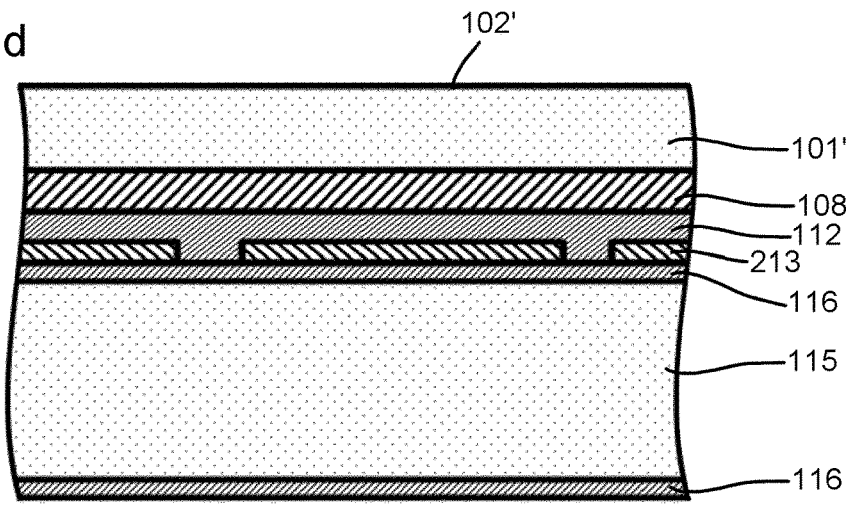
Figure 3E:
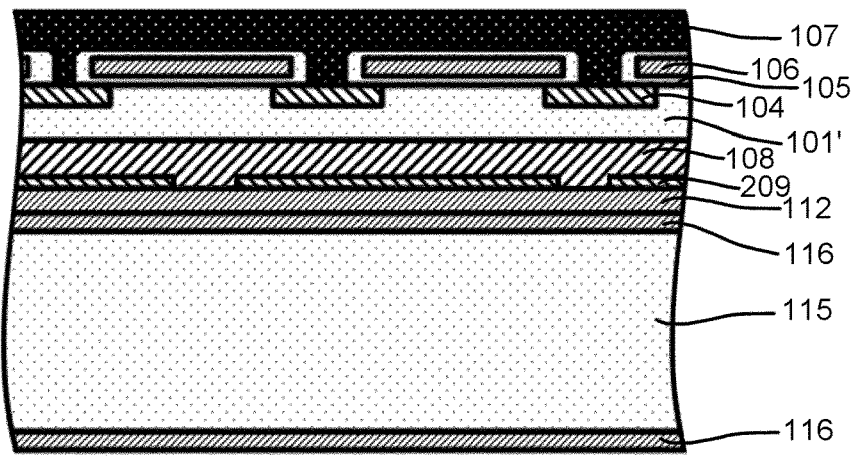
Figure 3F:
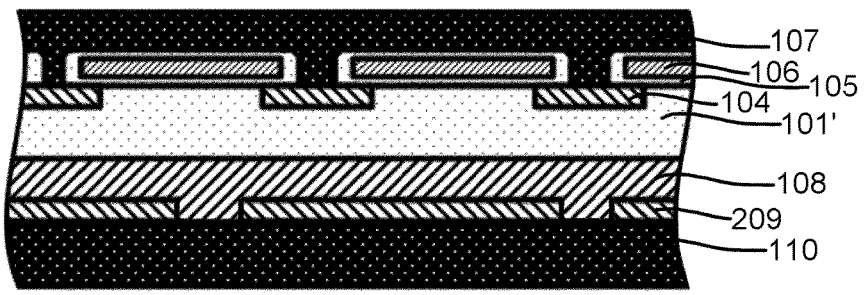

FIG. 3a corresponds to FIG. 2a as the first method step of providing the wafer 101 and forming the phosphorous implantation layer 111 on the backside of the wafer 101 is the same in the first and in the second embodiment. Next the thermal oxide layer 112 shown in FIG. 3b is formed as in the first embodiment. However, before ion implantation of boron is performed, a masking layer 220 is formed on the back side 103 of the wafer 101 to partially cover the oxide layer 112 formed on the back side 103 of the wafer 101. The masking layer 220 may be a resist layer, for example. After forming the masking layer 220 ion implantation is performed on the back side 103 of the wafer 101 as in the first embodiment. As in FIG. 2b for the first embodiment ion implantation is again indicated by arrows in FIG. 3b for the second embodiment. By the ion implantation through the openings in the masking layer 220, a thin structured boron implantation layer 213 is formed in the thermal oxide layer 112 on the back side 103 of the wafer 101. Also in this second embodiment, the implantation depth of boron shall be less than the thickness of the oxide layer 112. Subsequent steps of bonding the wafer 101 to a carrier wafer 115 and thinning the wafer 101 down to its final thickness as shown in FIG. 3d, of a front-end-of-line processing on the front side 102' of the thinned wafer 101' and of forming a metallization layer in form of a top metallization layer 107 on the thus formed topology as shown in FIG. 3e as well as of removing the carrier wafer and forming a metallization layer in form of a back side metallization layer 110 as shown in FIG. 3f are similar to the method steps as described with FIGS. 2d to 2f for the first embodiment. However, in the second embodiment a structured anode layer 209 is formed instead of the continuous anode layer 109 as in the first embodiment by diffusion of boron from the structured implantation layer 213 which is driven through the oxide layer 112 into the wafer 101' from its backside due to heat generated during the front-end-of-line processing.

It will be apparent for persons skilled in the art that modifications of the above described embodiments are possible without departing from the idea of the invention as defined by the appended claims.

The method of the invention to manufacture a semiconductor device comprising a thin wafer was described for manufacturing an IGBT in the first embodiment and for manufacturing a RC-IGBT in the second embodiment. However, the method of the invention can also be used to manufacture other semiconductor devices which comprise a thin semiconductor wafer and require a front-end-of-line processing on the front side of the semiconductor wafer as well as forming of a doped layer on the back side of the semiconductor wafer. Other semiconductor devices which can be manufactured by the method of the invention as defined in the appended claims are a bi-mode insulated gate transistor (BIGT), a PIN diode, a field charge extraction (FCE) diode, a gate turn-off (GTO) thyristor, an integrated gate-commutated thyristor (IGCT), for example. A BIGT is a RC-IGBT having pilot p-type anode regions on the first main side (back side) in a central area of the wafer. Each pilot region area is an area, in which any two n-doped first regions, which are arranged on the border to the pilot region, have a distance across the pilot region bigger than two times the base layer thickness (n-doped layer). That means that the pilot region may be enclosed by first regions which have a smaller distance to each other, but across the pilot region area, the distance between any two first regions has to be larger than two times the base layer thickness. A BIGT is described in U.S. Pat. No. 8,212,283 B2, for example.

In the above described embodiments boron was given as an example for a second impurity in the claims. However, depending on the semiconductor device which is to be manufactured, the second impurity may be any other dopant and may not only be a p-type dopant but may also be an n-type dopant. For example for manufacturing a PIN diode an n-type dopant may be used as the second impurity.

When manufacturing a PIN diode comprising a semiconductor wafer, for example, the highly doped n-type layer on the back side of a wafer can be formed by implanting an n-type dopant as an example for a second impurity into an oxide layer formed on the back side of the wafer. The implanted n-type dopant will then diffuse through the oxide layer into the back side of the wafer by heat applied throughout the subsequent front-end-of-line processing which includes the step of forming a highly doped p-type layer on the front side of the wafer. The n-type dopant used as a second impurity may be phosphorous or arsenic, for example.

In the above described second embodiment it was described to form a structured p-type anode layer by using a structured or patterned boron implantation layer. However, depending on the semiconductor device to be manufactured, it is also possible to have a structured implantation layer with a combination of two different dopants (for example an n-type dopant and a p-type dopant) by first forming the structured pattern of the first dopant as described in the above second embodiment with a first masking layer, then removing the first masking layer used for forming the structured pattern of the first dopant implantation layer, forming a second masking layer on the oxide layer on the wafer back side (first main side in the claims) and finally implanting the second dopant through the openings of the second masking layer. In this way a pattern of n-type and p-type layers can be formed in the final device. Such pattern would be required for a field charge extraction (FCE) diode, for example. Also in this modified embodiment, the implantation depth of the first and of the second dopant shall be less than the thickness of the oxide layer, respectively.

Phosphorous was used in the above first and second embodiment as an example for the first impurity in the claims. However, depending on the semiconductor device to be manufactured, any other dopant may be used as the first impurity in the claims. It can be either an n-type dopant or a p-type dopant.

In the above described embodiments a p-type dopant was used as an example for the second impurity in the claims and an n-type dopant was used as an example for the first impurity in the claims. However, the first and the second impurity in the claims do not have to be dopants of a different conductivity type. The first and the second impurity may be both n-type dopants or may be both p-type dopants.

In the above described embodiments ion implantation was used to apply the first impurity onto the back side of the wafer. Other methods of applying the first impurity onto the back side of the wafer could be used such as depositing the first impurity onto the back side. The first impurity could be deposited onto the back side of the wafer in form of a doped glass layer, for example. In general, in the claims, applying an impurity onto the first main side means providing an impurity at the first main side of the semiconductor wafer by implanting the impurity into the semiconductor wafer from its first main side or by depositing a layer, which is doped with the impurity, directly on the first main side of the semiconductor wafer.

In the above described embodiments a low-doped n-type silicon wafer was used as an example for a semiconductor wafer in the claims. However, depending on the semiconductor device to be manufactured, any other semiconductor wafer can be used. The semiconductor wafer must not be a silicon substrate but can be of any other semiconductor material. It can be an n-type, p-type or intrinsic semiconductor wafer.

In the above described embodiments thinning of the semiconductor wafer was performed after the bonding step but it can also be performed before the bonding step.

In the above described embodiments the top and back metallization layers was performed separately but the top metallization layer may also be formed simultaneously together with the back metallization layer in the same process step after the step of removing the carrier wafer.

In the above described embodiments the front-end-of-line processing comprised steps of forming p-type regions, n-type regions embedded in the p-type regions, oxide layers and poly-silicon gates. However, depending on the device to be manufactured, the front-end-of-line processing may comprise other process steps. It is sufficient if the front-end-of-line processing comprises process steps during which enough heat is generated to drive the second impurity from the oxide layer into the semiconductor wafer from its first main side by diffusion. Such process step can be a step for forming an anode layer and/or a cathode layer, for example. The temperature during at least one step of the front-end-of-line processing is exemplarily above 900° C., exemplarily above 950° C. and exemplarily above 1250° C. For power semiconductor devices such high temperature step may be the step of activation and diffusion of a dopant subsequent to its implantation into the semiconductor wafer front side (i.e. the second main side in the claims).

In the above described embodiments, boron as a first dopant was implanted into the oxide layer 112 by ion implantation to form an oxide layer on the front side of the wafer which is partially doped with the first dopant. However, it is also possible to incorporate the first dopant during the growth of the oxide layer 112 by adding a precursor for the first dopant to the vapour during thermal oxidation of the semiconductor wafer, for example. In this case the precursor shall be added to the vapour only after a predetermined time after the start of the thermal oxidation.

It should be noted that the term "comprising" does not exclude other elements or steps and that the indefinite article "a" or "an" does not exclude the plural. Also elements described in association with different embodiments may be combined.

LIST OF REFERENCE SIGNS

1 wafer
1' thinned wafer
2 front side
3 back side
3' back side of thinned wafer
4 p-type region
5 oxide layer
6 poly-silicon gate
7 top metallization
8 buffer layer
9 anode layer
10 back side metallization
101 wafer
101' thinned wafer
102 front side
102' front side of thinned wafer
103 back side
103' back side of thinned wafer
104 p-type region
105 oxide layer
106 poly-silicon gate
107 top metallization layer
108 buffer layer
109 anode layer
110 back side metallization layer
111 phosphorous implantation layer
112 oxide layer
113 boron implantation layer
115 carrier wafer
116 oxide barrier layer
209 anode layer
213 boron implantation layer
220 masking layer

The invention claimed is:
1. A method for manufacturing a vertical power semiconductor device, wherein the method comprises the following steps:

(a) providing a semiconductor wafer having a first main side and a second main side opposite to the first main side;
(b) applying a first impurity onto the first main side;
(c) forming a first oxide layer on at least the first main side of the semiconductor wafer;
(d) after step (c) bonding a carrier wafer to the first oxide layer on the first main side of the semiconductor wafer;
(e) after the bonding step (d) front-end-of-line processing on the second main side of the semiconductor wafer;
(f) after the front-end-of-line processing step (e) at least partially removing the carrier wafer and the first oxide layer on the first main side of the semiconductor wafer; and
(g) after the removing step (f) forming a back metallization layer on the first main side of the semiconductor wafer to form an Ohmic contact to the semiconductor wafer,
wherein
in step (c) partially doping the first oxide layer formed on the first main side of the semiconductor wafer with a second impurity in such way that any first portion of the first oxide layer which is doped with the second impurity is spaced away from the semiconductor wafer by a second portion of the first oxide layer which is not doped with the second impurity and which is disposed between the first portion of the first oxide layer and the first main side of the semiconductor wafer,
in step (e) diffusing the second impurity from the first oxide layer into the semiconductor wafer from its first main side by heat generated during the front-end-of-line processing,
in step (f) completely removing the carrier wafer and the first oxide layer on the first main side of the semiconductor wafer.

2. The method for manufacturing a semiconductor device according to claim 1, comprising a step of thinning the semiconductor wafer after step (a) but before the front-end-of-line processing step (e).

3. The method for manufacturing a semiconductor device according to claim 2, wherein the step of thinning the semiconductor wafer is performed by thinning the semiconductor wafer from its second main side after the bonding step (d).

4. The method for manufacturing a semiconductor device according to claim 2, wherein the step of thinning the semiconductor wafer is performed before the first oxide layer forming step (c).

5. The method for manufacturing a semiconductor device according to claim 1, wherein the first oxide layer is formed by thermal oxidation.

6. The method for manufacturing a semiconductor device according to claim 1, wherein the step (b) of applying a first impurity onto its first main side is performed by ion implantation of the first impurity into the semiconductor wafer from its first main side and a buffer layer in the semiconductor device is formed by diffusion of the implanted first impurity due to heat generated in subsequent method steps.

7. The method for manufacturing a semiconductor device according to claim 1, wherein a third impurity is implanted into the semiconductor wafer through the first oxide layer to form a second buffer layer by diffusion of the implanted third impurity due to heat generated in subsequent method steps.

8. The method for manufacturing a semiconductor device according to claim 1, wherein the carrier wafer has a second oxide layer formed on its surface at least where the carrier wafer comes into contact with the first oxide layer during the bonding step (d) as a barrier for the impurities in the carrier wafer during the front-end-of-line processing step (e).

9. The method for manufacturing a semiconductor device according to claim 1, wherein the front-end-of-line processing step (e) comprises at least a step of forming at least one of a first anode layer or a first cathode layer on the second main side of the semiconductor wafer.

10. The method for manufacturing a semiconductor device according to claim 1, wherein the first oxide layer forming step (c) comprises forming a mask on the first oxide layer and subsequent ion implantation of the second impurity into the first oxide layer through openings in the mask to selectively dope areas of the first oxide layer which are exposed through the openings in the mask.

11. The method for manufacturing a semiconductor device according to claim 1, wherein the second impurity in the first oxide layer is diffused into the semiconductor wafer by heat generated during the front-end-of-line processing step (e) to form at least one of a second anode layer or a second cathode layer on the first main side of the semiconductor wafer.

12. The method for manufacturing a semiconductor device according to claim 1, wherein the semiconductor device is a diode, a gate turn-off (GTO) thyristor, an integrated gate-commutated thyristor (IGCT), a bipolar transistor such as an insulated gate bipolar transistor (IGBT), a reverse conducting insulating gate bipolar transistor (RC-IGBT) or a bi-mode insulated gate transistor (BIGT).

13. The method for manufacturing a semiconductor device according to claim 2, wherein the first oxide layer is formed by thermal oxidation.

14. The method for manufacturing a semiconductor device according to claim 3, wherein the first oxide layer is formed by thermal oxidation.

15. The method for manufacturing a semiconductor device according to claim 1, wherein the step (h) of applying a first impurity onto its first main side is performed by ion implantation of the first impurity into the semiconductor wafer from its first main side and a buffer layer in the semiconductor device is formed by diffusion of the implanted first impurity due to heat generated in subsequent steps;
wherein the first oxide layer is formed by thermal oxidation;
comprising a step of thinning the semiconductor wafer after step (a) but before the front-end-of-line processing step (e);
wherein the step of thinning the semiconductor wafer is performed by thinning the semiconductor wafer from its second main side after the bonding step.

16. The method for manufacturing a semiconductor device according to claim 2, wherein a third impurity is implanted into the semiconductor wafer, through the first oxide layer to form a second buffer layer by diffusion of the implanted third impurity due to heat generated in subsequent method steps.

17. The method for manufacturing a semiconductor device according to claim 15, wherein a third impurity is implanted into the semiconductor wafer, through the first oxide layer to form a second buffer layer by diffusion of the implanted third impurity due to heat generated in subsequent method steps.

18. The method for manufacturing a semiconductor device according to claim 2, wherein the first oxide layer forming step (c) comprises forming a mask on the first oxide layer and subsequent ion implantation of the second impurity into the first oxide layer.

19. The method for manufacturing a semiconductor device according to claim 3, wherein the first oxide layer forming step (c) comprises forming a mask on the first oxide layer and subsequent ion implantation of the second impurity into the first oxide layer.

20. The method for manufacturing a semiconductor device according to claim 1, wherein the semiconductor device is one of a diode, a gate turn-off (GTO) thyristor, an integrated gate-commutated thyristor (IGCT), a bipolar transistor such as an insulated gate bipolar transistor (IGBT), a reverse conducting insulating gate bipolar transistor (RC-IGBT) or a bi-mode insulated gate transistor (BIGT);
 wherein the second impurity in the first oxide layer is diffused into the semiconductor wafer by heat generated during the front-end-of-line processing step (e) to form at least one of a second anode layer or a second cathode layer on the first main side of the semiconductor wafer;
 comprising a step of thinning the semiconductor wafer after step (a) but before the front-end-of-line processing step (e); and
 wherein the step of thinning the semiconductor wafer is performed before the first oxide layer forming step (c).

* * * * *